United States Patent [19]
Ohmori et al.

[11] Patent Number: 5,559,479
[45] Date of Patent: Sep. 24, 1996

[54] VOLTAGE CONTROL OSCILLATOR VARIABLE CAPACITANCE DIODE BIASING CIRCUIT

[75] Inventors: Hideki Ohmori; Kenji Fukayama, both of Kawasaki, Japan

[73] Assignee: Fujitsu Limited, Kanagawa, Japan

[21] Appl. No.: 404,728

[22] Filed: Mar. 15, 1995

[30] Foreign Application Priority Data

Mar. 17, 1994 [JP] Japan .................................. 6-047548

[51] Int. Cl.6 .................................................. H03B 5/00
[52] U.S. Cl. .................................. 331/177 V; 331/36 C; 331/185
[58] Field of Search ................... 331/36 C, 117 R, 331/117 FE, 117 D, 177 V, 185, 186

[56] References Cited

U.S. PATENT DOCUMENTS

| | | | |
|---|---|---|---|
| 3,723,906 | 3/1973 | Pederson | 331/117 D |
| 4,055,822 | 10/1977 | Rinderle | 331/177 V X |
| 4,064,467 | 12/1977 | Kupfer | 331/177 V X |
| 4,160,964 | 7/1979 | Ishikawa et al. | 331/177 V X |
| 4,550,293 | 10/1985 | Driscoll | 331/116 R |
| 4,660,002 | 4/1987 | Iijima et al. | 331/117 D X |
| 4,748,425 | 5/1988 | Heck | 331/36 C X |

FOREIGN PATENT DOCUMENTS 52-75211  6/1977  Japan .................................. 331/177 V

*Primary Examiner*—David Mis
*Attorney, Agent, or Firm*—Nikaido Marmelstein Murray & Oram LLP

[57] ABSTRACT

A voltage control oscillator which has an oscillator circuit comprising at least an inductive resonator, active element, and variable capacitance diode and externally applies a direct current control voltage to the variable capacitance diode through a bias circuit to change an oscillation frequency by altering a capacitance value of the variable capacitance diode with variations of the direct current voltage, comprising bias circuit is a low-pass filter comprising a resistor and a capacitor and the oscillation frequency is set higher than a cut-off frequency of the low-pass filter.

12 Claims, 20 Drawing Sheets

| | | |
|---|---|---|
| $R_1$ | 33KΩ ± 5% | 40mV |
| $R_2$ | 24KΩ ± 5% | 40mV |
| $R_3$ | 47KΩ ± 5% | 40mV |
| $R_4$ | 470KΩ ± 5% | 40mV |
| $R_5$ | 470KΩ ± 5% | 40mV |
| $R_6$ | 47KΩ ± 5% | 40mV |
| $R_7$ | 33KΩ ± 5% | 40mV |
| $R_8$ | 1KΩ ± 5% | 40mV |
| $Q_1$ | 2SC2480 | |
| $Q_2$ | 2SC2480 | |
| $D_1$ | 2X1C0054 | |

Fig. 19

| $C_1$ | 1000pF | ±10% | 25V |
| $C_2$ | 100pF | ±10% | 50V |
| $C_3$ | 56pF | ±10% | 50V |
| $C_4$ | 56pF | ±10% | 50V |
| $C_5$ | 1000pF | ±10% | 25V |

Fig. 20

VOLTAGE CONTROL OSCILLATOR VARIABLE CAPACITANCE DIODE BIASING CIRCUIT

BACKGROUND OF THE INVENTION

1. Field of the Invention

The present invention relates to an oscillator circuit, and more specifically to a voltage control oscillator for use in a phase locked loop (PLL) circuit to cover a wide range of oscillation frequency within a predetermined voltage range.

According to the present invention, an oscillator circuit comprises a resonator including an inductive resonator such as a coil, an active element such as a transistor and IC, and a variable capacitance diode. With the configuration, a direct current control voltage (hereinafter referred to as a control voltage) is externally provided for the variable capacitance diode through a bias circuit. The control voltage is changed to vary the capacitance value of the variable capacitance diode, and finally to vary the oscillation frequency of the oscillator circuit.

With the voltage control oscillator, the impedance element of the bias circuit is divided into two or more elements. A capacitance element is connected between earth and the connection point among the two or more elements. The values of the impedance elements and the capacitance elements are set such that the relation between the cut-off frequency f1 of a first low-pass filter comprising the impedance element near the variable capacitance diode and the capacitance element and the output oscillation frequency f0 of the voltage control oscillator is f0>f1, and the relation between the cut-off frequency f2 of a second low-pass filter comprising the impedance element near the input terminal of the control voltage and the capacitance element and the cut-off frequency f1 of the first low-pass filter is f1>f2.

With these configuration and settings, externally applying a direct current control voltage to the input terminal varies the oscillation frequency depending on the magnitude of the control voltage. For example, the magnitude of the control voltage is inversely proportional to the capacitance value of the variable capacitance diode. Therefore, a high control voltage produces a high oscillation frequency. Since the bias circuit regards the input terminal and the oscillator circuit as being separate from each other, the influence of the rectification of the variable capacitance diode in the oscillator circuit can be successfully reduced. Thus, the range of logically obtained oscillation frequency can approximately match the range of actual oscillation frequency.

2. Description of the Prior Art

With the increasing demand for multimedia and digital audio units, signal synchronization at a high frequency is strongly required.

To meet this demand, the voltage control oscillator is used with the PLL circuit. FIG. 1 shows the configuration of the conventional voltage control oscillator. The voltage control oscillator shown in FIG. 1 comprises a resonator 1 including an inductive resonator such as a coil; an active oscillator circuit 2 such as a transistor and an IC; a variable capacitance diode 3; an impedance element 4 (hereinafter referred to also as a resistor) for limiting the current through the variable capacitance diode; and input terminals 5a and 5b (input terminal 5b is grounded).

With the above listed configuration, applying a direct current voltage to input terminals 5a and 5b allows the control voltage to be applied to the variable capacitance diode 3 through the impedance element 4. The capacitance value of the variable capacitance diode 3 alters with the magnitude of the control voltage applied as a reverse bias voltage. That is, the magnitude of the control voltage is inversely proportional to the capacitance value. Therefore, a high control voltage produces a high oscillation frequency.

Thus the oscillation frequency varies with a change in an external control voltage within a predetermined range.

The required performance of the voltage control oscillator is good stability and a wide variable frequency range, that is, a wide frequency variation within the range of a predetermined control voltage.

However, if the control voltage is altered from 0 V to 5 V for the conventional voltage control oscillator, the oscillation frequency does not vary as low as a preliminarily calculated value at a lower voltage. FIG. 2 shows the variations of the oscillation frequency in relation to the control voltage. In FIG. 2, the vertical axis indicates normalized frequency variations ($\Delta f/f$ where f indicates an oscillation frequency; $\Delta f$ indicates the change amount in the oscillation frequency and is represented by ppm), while the horizontal axis indicates a control voltage. The solid curve represents the actual variations of the frequency, and the dashed curve represents the ideal variations.

FIG. 2 shows the frequency variations when a given control voltage ranges from 0 V to 5 V. Ideally, the frequency should vary as shown by the dashed curve in FIG. 2. That is, the frequency variations should range from approximately −4200 ppm to +1500 ppm corresponding to the control voltage from 0 V to 5 V respectively. Thus, the frequency ideally varies as shown by the dashed curve in FIG. 2 if the control voltage alters from 0 V to 5 V.

However, in this example, the frequency actually varies from approximately −3200 ppm to +1500 ppm corresponding to the range of the control voltage from 1.48 V to 5 V. That is, the frequency is not so low as the value calculated for the control voltage of 0 V but is lowered to the frequency of approximately −3200 ppm at the control voltage of 1.48 V even if the control voltage of 0 V is externally applied in practice.

This is because an offset voltage of approximately 1.48 V has been generated at the cathode of the variable capacitance diode 3 even when the control voltage of 0 V is externally applied. The offset voltage of approximately 1.48 V is generated at the cathode of the variable capacitance diode 3 on the following grounds even when the control voltage of 0 V is externally applied.

FIG. 3 shows the circuit equivalent to the oscillator unit shown in FIG. 1. The circuit comprises a diode D, a capacitor C, a coil L, and a negative resistor R. If the equivalent circuit oscillates at 10 MHz, then oscillation current I flows through the circuit and the diode D apparently performs detection and rectification processes and generates as a result a direct current at the cathode of the diode D (approximately 1.48 V in this example). That is, as shown in FIG. 4, the rectification at the oscillation at 10 MHz produces the potential of approximately 1.48 V relative to the ground level G at the cathode of the diode D.

FIG. 5 shows this operation as actual data obtained through an oscilloscope. In FIG. 5, the vertical axis indicates the potential at the cathode of the diode D, while the horizontal axis indicates time. When the control voltage is 0 V, the potential at the cathode of the diode D should be the ground level G, but is 1.48 V actually.

Thus, the voltage of approximately 1.48 is applied as a reverse bias voltage at the cathode of the variable capacitance diode 3 even if the control voltage of 0 V is externally applied in practice. Therefore, even if the control voltage of 0 V is assumed, the reverse bias voltage of 1.48 V is actually applied to the variable capacitance diode 3. Therefore, the variations of the oscillation frequency range correspondingly and show the range narrower than the expected range.

The important function of a voltage control oscillator is to cover a wide range of oscillation frequency within a predetermined voltage range. With the above described conventional voltage control oscillator, the oscillation frequency cannot be lowered to the expected level at a lower control voltage and the actual range of the oscillation frequency is narrower than the calculated range.

SUMMARY OF THE INVENTION

The present invention has been developed to solve the above described problems with the prior art technology, and aims at realizing the actual range of the oscillation frequency almost matching the calculated range of the oscillation frequency, thereby marking a wide range of the oscillation frequency within a predetermined voltage range.

According to the present invention, an oscillator circuit comprises a resonator including an inductive resonator such as a coil, an active element such as a transistor and IC, and a variable capacitance diode. With the configuration, a control voltage is externally provided for the variable capacitance diode through a bias circuit. The control voltage is changed to vary the capacitance value of the variable capacitance diode, and finally to vary the oscillation frequency of the oscillator circuit. With the voltage control oscillator, the impedance element of the bias circuit is divided into at least two elements, each being connected to each other's connection point. A capacitance element is connected between the connection point and earth. The values of the impedance elements and the capacitance elements are set such that the relation between the cut-off frequency f1 of a first low-pass filter comprising the impedance element near the variable capacitance diode and the capacitance element and the output oscillation frequency f0 of the voltage control oscillator is f0>f1, and the relation between the cut-off frequency f2 of a second low-pass filter comprising the impedance element near the input terminal of the control voltage and the capacitance element and the cut-off frequency f1 of the first low-pass filter is f1>f2.

With these configuration, externally applying a direct current control voltage to the input terminal varies the oscillation frequency depending on the magnitude of the control voltage. For example, the magnitude of the control voltage is inversely proportional to the capacitance value of the variable capacitance diode. Therefore, a high control voltage produces a high oscillation frequency. The input terminal and the oscillator circuit are separate from each other in the bias circuit and therefore reduced is the influence of the rectification of the variable capacitance diode in the oscillator circuit. This is because the values of the impedance elements and the capacitance elements are set such that the relation between the cut-off frequency f1 of the first low-pass filter and the output oscillation frequency f0 of the voltage control oscillator is f0>f1, and the relation between the cut-off frequency f2 of the second low-pass filter comprising the impedance element near the input terminal of the control voltage and the capacitance element and the cut-off frequency f1 of the first low-pass filter is f1>f2.

That is, the values of the impedance elements and the capacitance elements are set such that the relation between the cut-off frequency f1 of a first low-pass filter comprising the capacitance element and the impedance element near the variable capacitance diode and the oscillation frequency f0 of the oscillator circuit is f0>f1, and the relation between the cut-off frequency f1 of the first low-pass filter and the cut-off frequency f2 of the second low-pass filter comprising the impedance element near the input terminal and the capacitance element is f1>f2. Therefore, the impedance of the capacitance element appears small when viewed from the oscillator circuit and it is assumed that the impedance element is connected in parallel with the variable capacitance diode. The impedance of the capacitance element appears large when viewed from the input terminal of the control voltage. That is, it is assumed that the impedance element is connected in parallel with the variable capacitance diode when viewed from the oscillator circuit, thereby reducing the oscillation voltage generated between the cathode and the anode of the variable capacitance diode and also reducing the generation of the direct current voltage through the rectification. Since the impedance of the capacitance element appears large when viewed from the input terminal of the control voltage, the external control voltage is applied as is to the variable capacitance diode.

Thus, the voltage can be reduced approximately to 0 even if a direct current voltage is generated through the rectification between the cathode and the anode of the variable capacitance diode with the control voltage of 0. Accordingly, with the control voltage of approximately 0, the oscillation frequency can be as low as a desired value and the actual range of the oscillation frequency can almost match the logically obtained range of the oscillation frequency.

BRIEF DESCRIPTION OF THE DRAWINGS

FIG. 19 shows the values of the resistor according to an embodiment of the present invention; and FIG. 20 shows the capacitance values of the capacitor according to an embodiment.

DESCRIPTION OF THE PREFERRED EMBODIMENTS

Explanation of the Principle

Figure 6:
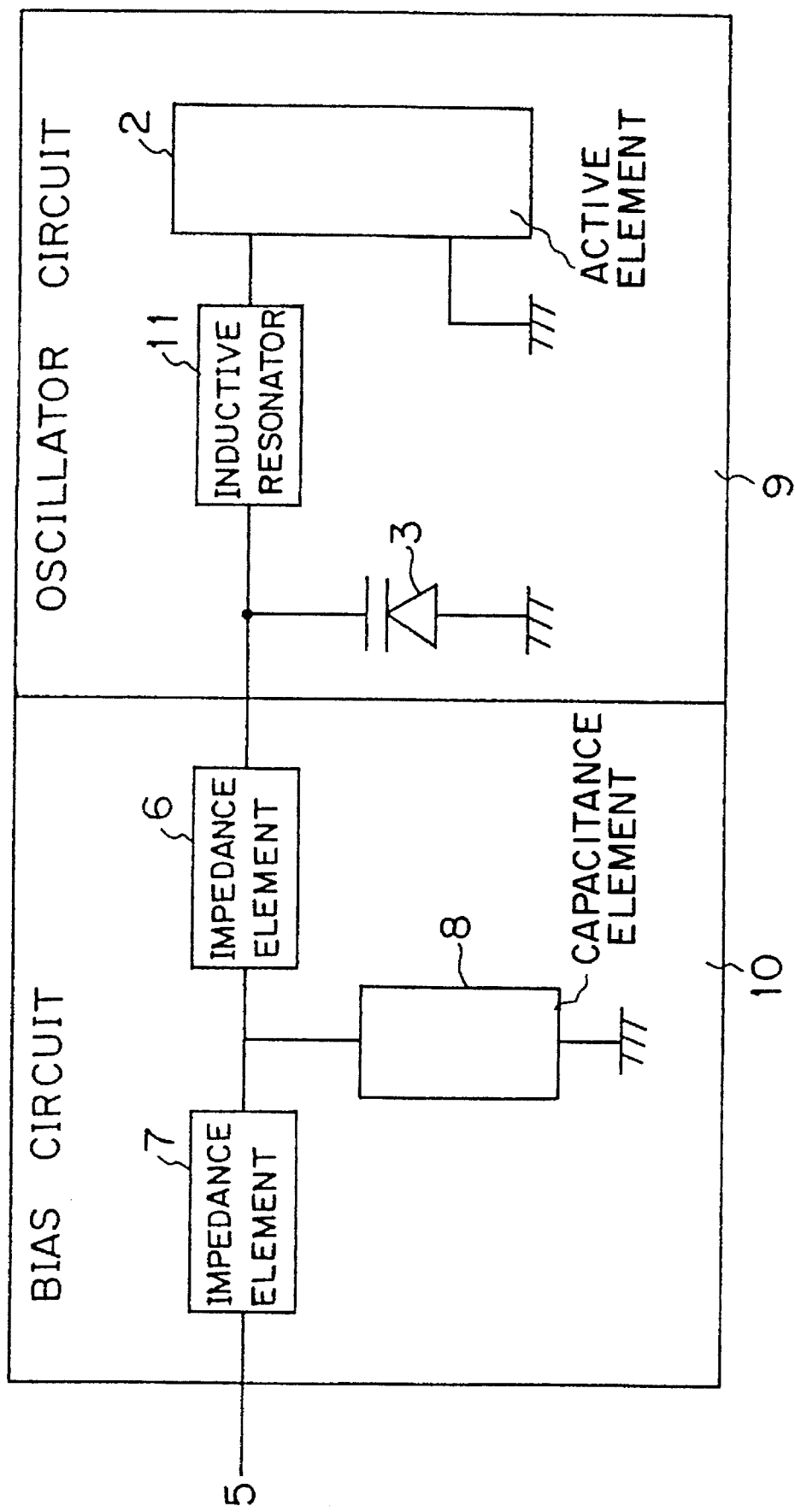
FIG. 6 shows the principle of the present invention.

FIG. 6 shows the principle of the present invention. According to the present invention, the oscillator circuit comprises a resonator 11 including a coil, an active element 2 such as transistors and ICs, and a variable capacitance diode 3. The oscillator circuit is used for a voltage control oscillator for receiving a direct current control voltage (hereinafter referred to as a control voltage) at the input terminal 5, applying it to the variable capacitance diode 3 through the bias circuit 10, altering the control voltage to vary the capacitance value of the variable capacitance diode 3, thereby varying the oscillation frequency of the oscillator circuit 9.

With the variable capacitance diode, the bias circuit 10 comprises two or more serially connected impedance elements 6 and 7, and a capacitance element 8 provided between earth and the two or more impedance elements 6 and 7. The values of the impedance elements 6 and 7 and the capacitance elements 8 are set such that, among the two or more impedance elements 6 and 7, the relation between the cut-off frequency f1 of a first low-pass filter comprising the impedance element 6 near the variable capacitance diode 3 and the capacitance element 8 and the oscillation frequency f0 of the oscillator circuit 9 is f0>f1, and the relation between the cut-off frequency f1 of the first low-pass filter and the cut-off frequency f2 of a second low-pass filter comprising the impedance element 7 near the input terminal 5 and the capacitance element 8 is f1>f2.

With the configuration, externally applying a direct current control voltage to the input terminal 5 alters oscillation frequency depending on the magnitude of the control voltage. For example, the magnitude of the control voltage is inversely proportional to a capacitance value of the variable capacitance diode 3. Therefore, a high control voltage produces a high oscillation frequency. Since the impedance elements 6 and 7 and the capacitance element 8 are set such that the relation between the cut-off frequency f1 of the first low-pass filter and the oscillation frequency f0 of the oscillator circuit 9 and the relation between the cut-off frequency f1 of the first low-pass filter and the cut-off frequency f2 of the second low-pass filter comprising the impedance element 7 near the input terminal 5 and the capacitance element 8 are set as described above, the bias circuit 10 separates the input terminal 5 which receives the control voltage from the oscillator circuit 9. Therefore, the influence of the rectification of the variable capacitance diode 3 in the oscillator circuit 9 can be successfully reduced.

That is, the values of the impedance elements 6 and 7 and the capacitance elements 8 are set such that the relation between the cut-off frequency f1 of the first low-pass filter comprising the capacitance element 8 and the impedance element 6 near the variable capacitance diode 3 and the oscillation frequency f0 of the oscillator circuit 9 is f0>f1, and the relation between the cut-off frequency f1 of the first low-pass filter and the cut-off frequency f2 of the second low-pass filter comprising the impedance element 7 near the input terminal 5 and the capacitance element 8 is f1>f2. Therefore, the impedance of the capacitance element appears small when viewed from the oscillator circuit 9 and it is assumed that the impedance element 6 is connected in parallel with the variable capacitance diode. The impedance of the capacitance element appears large when viewed from the input terminal 5 of the control voltage. That is, it is assumed that the impedance element 6 is connected in parallel with the variable capacitance diode when viewed from the oscillator circuit 9, thereby reducing the oscillation voltage generated between the cathode and the anode of the variable capacitance diode and also reducing the generation of the direct current voltage through the rectification. Since the impedance of the capacitance element appears large when viewed from the input terminal 5, the external control voltage is applied as is to the variable capacitance diode.

Thus, the voltage can be reduced approximately to 0 even if a direct current voltage is generated through the rectification between the cathode and the anode of the variable capacitance diode with the control voltage of 0. Accordingly, with the control voltage of approximately 0, the oscillation frequency can be as low as a desired value and the actual range of the oscillation frequency can almost match the logically obtained range of the oscillation frequency.

Embodiments

Described below is the embodiment of the present invention.

Figure 7:
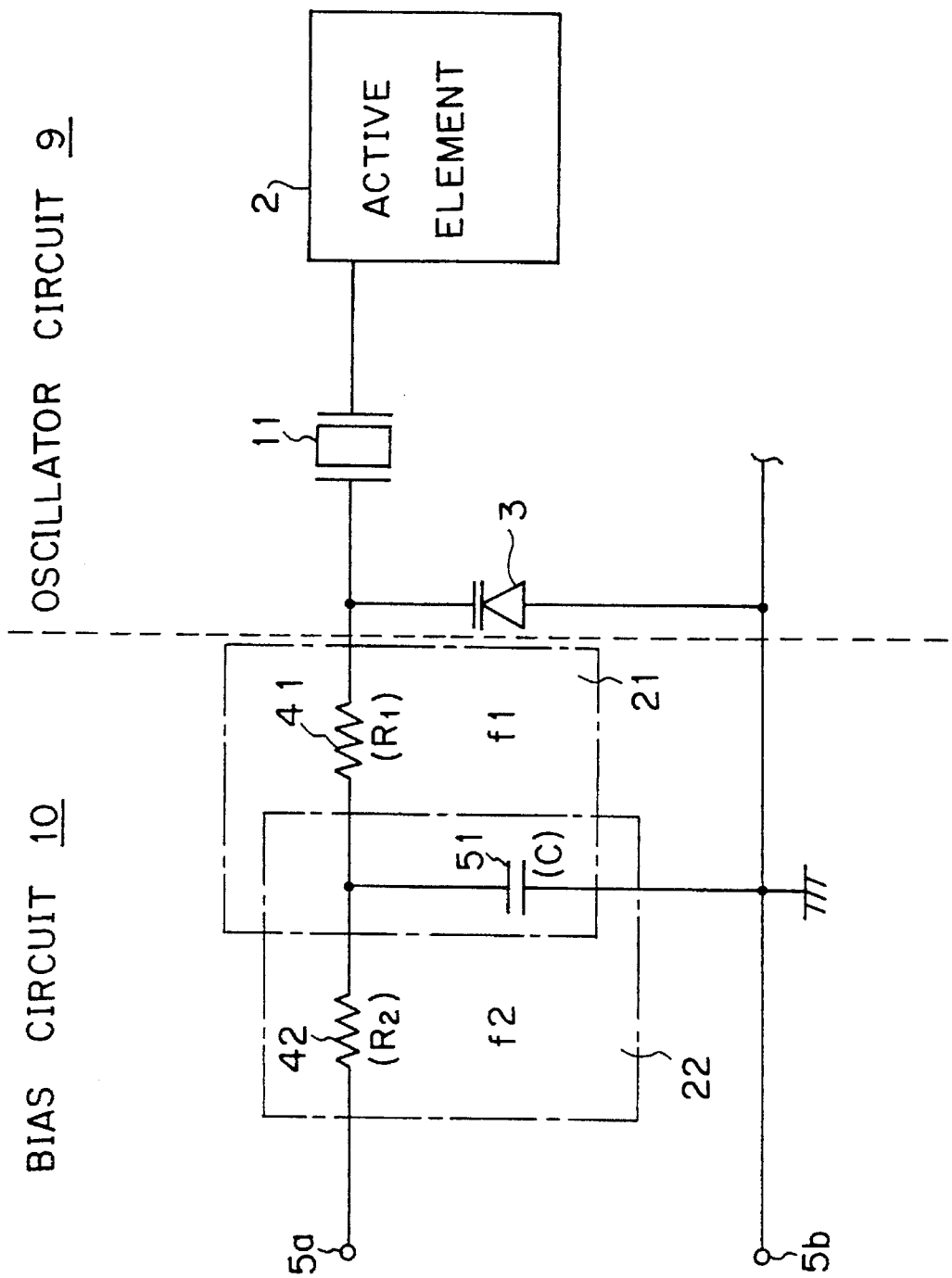
FIG. 7 shows an embodiment of the present invention.

FIG. 7 shows the first embodiment of the present invention. The oscillator circuit 9 comprises the active element 2, the resonator 11, and the variable capacitance diode 3. The anode of the variable capacitance diode 3 is grounded and its cathode is connected to one terminal of the resonator 11. The other terminal of the resonator 11 is connected to the active element 2. The active element 2 is an equivalent negative resistance element comprising a transistor, IC, etc. (not shown in FIG. 7), and forms part of a serial oscillator circuit with the variable capacitance diode 3, the resonator 11, and the active element 2. The present invention is not limited to a serial oscillator circuit, but can be applied to a parallel oscillator circuit.

The variable capacitance diode 3 is an equivalent variable capacitor, and the oscillator circuit 9 oscillates through its resonator 11 a current at a frequency of the inductance opposite to the capacitance of the variable capacitor. According to this embodiment, the inductive resonator 11 is made of lithium tantalate, crystal, etc.

The bias circuit 10 is provided with two serially connected resistors 41 and 42 as impedance elements to apply a direct current control voltage to the variable capacitance diode 3. A capacitor 51 is connected as a capacitance element between earth and the connection point between the two resistors 41 and 42.

The two serially connected resistor 41 and 42 limit a current passing through the variable capacitance diode 3. In the present embodiment, a total of resistance values ($R_1$ indicates the value of resistor 41, and $R_2$ indicates the value of resistor 42) is assumed to be approximately a few ten K$\Omega$—a few hundred K$\Omega$. That is, the resistance of approximately 10K$\Omega$—some 100K$\Omega$ is applied as being divided into $R_1$ and $R_2$ to meet the conditions of cutoff frequency. For example, $R_1$=1K$\Omega$, $R_2$=30K$\Omega$.

The capacitor 51 is connected in parallel with the variable capacitance diode 3 through the resistor 41. It is connected through the resistance of the impedance element because the variable capacitance diode 3 cannot function as a variable capacitance diode if the capacitor 51 is directly connected in parallel with the variable capacitance diode 3 not through the impedance element. Accordingly, it is necessarily connected through the impedance element (the resistor 41 in this embodiment). The values are set under the following conditions.

The values are set such that the relation between the cut-off frequency f1 of a first low-pass filter 21 comprising the resistor 41 near the variable capacitance diode 3 and the capacitor 51 and the cut-off frequency f2 of a second low-pass filter 22 comprising a resistor 42 near the input terminal of the control voltage (near the input terminal 5a of the control voltage) and the capacitor 51 is f1>f2.

The cut-off frequency f1 is calculated by the following equation (1) where C indicates the capacitance of the capacitor 51.

$$f1 = f/(2\pi R_1 \cdot C) \qquad (1)$$

Likewise, the cut-off frequency f2 is calculated by the following equation (2).

$$f2 = f/(2\pi R_2 \cdot C) \qquad (2)$$

Then, the values are set such that the relation between the cut-off frequency f1 of the first low-pass filter 21 and the oscillation frequency f0 of the voltage control oscillator is f1<f0, that is, represented by the following equation (3).

$$1/(2\pi R_1 \cdot C) < F0 \qquad (3)$$

The values of the resistors 41 and 42 and the capacitance of the capacitor 51 are selected to satisfy the above listed conditions. For example, the resistance value $R_1$ of the resistor 41, the resistance value $R_2$ of the resistor 42, and the capacitance of the capacitor are set to 1K$\omega$, 30K$\Omega$, and 1,000 pF respectively. The oscillation frequency f0 is 10 MHz.

With the configuration and settings, the circuit is operated as follows.

Externally applying a direct current control voltage to the input terminals 5a and 5b alters an oscillation frequency depending on the magnitude of the control voltage. For example, when the control voltage varies in the range of 0 V to 5 V, the capacitance value of the variable capacitance diode 3 is inversely proportional to the magnitude of the control voltage. Therefore, a high control voltage produces high oscillation frequency.

The relation between the cut-off frequency f1 of the first low-pass filter 21 comprising the capacitor 51 and the resistor 41 and the cut-off frequency f2 of the second low-pass filter 22 comprising the resistor 42 near the input terminal 5a of the control voltage and the capacitor 51 is f1<f2. Also, the relation between the cut-off frequency f1 of the first low-pass filter 21 and the oscillation frequency f0 of the voltage control oscillator if f0>f1. Therefore, with the control voltage set to 0, the impedance of the capacitor 51 appears small when viewed from the oscillator circuit 9. This is equivalent to the connection of a small impedance element, that is, the resistor 41, in parallel with the variable capacitance diode 3, thereby reducing the influence of the rectification. That is, with the above settings, the voltage lowered by the rectification produces a oscillation frequency depending on the magnitude of the control voltage.

Figure 8:
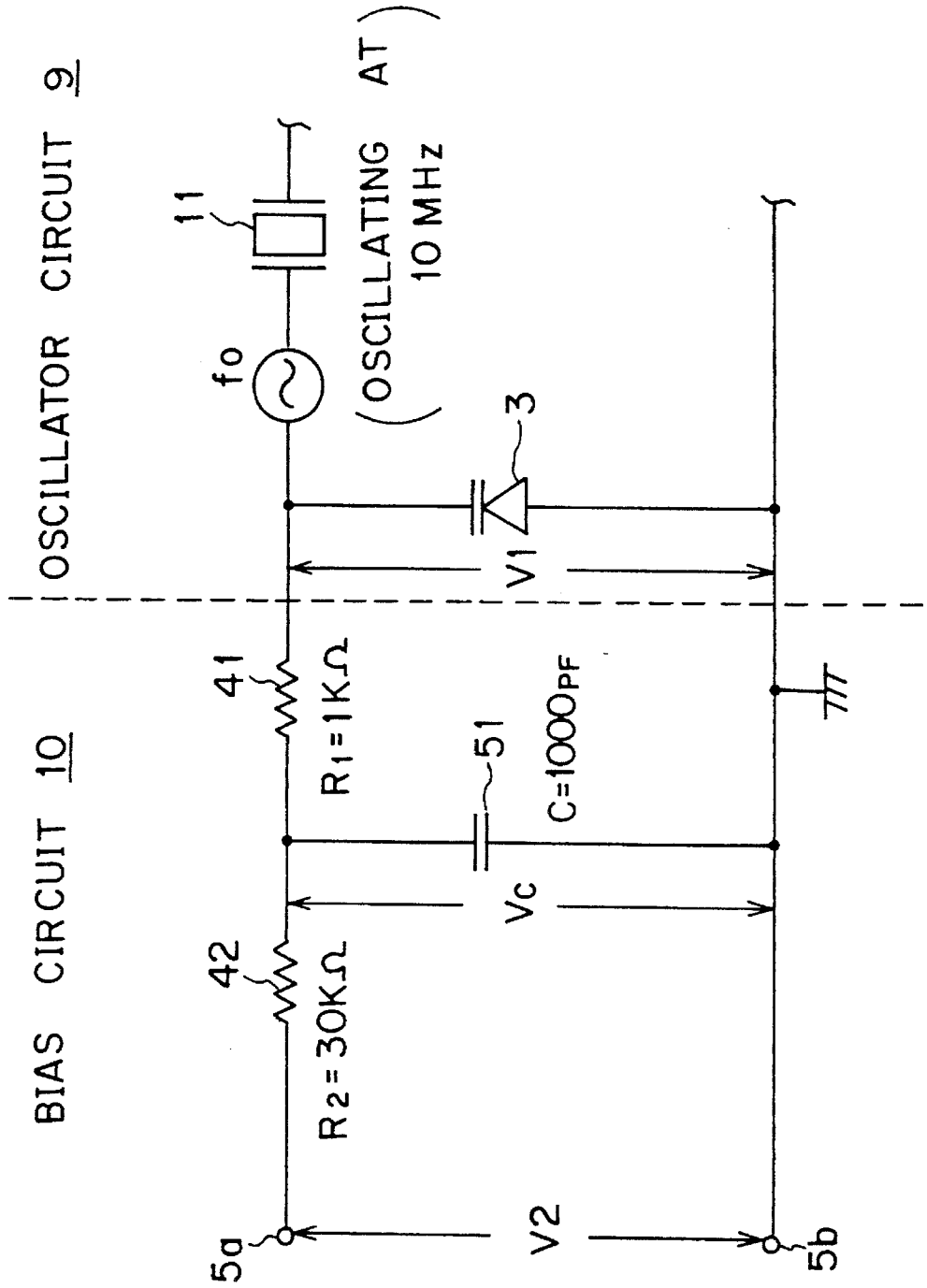
FIG. 8 shows the a practical example of the operation according to the embodiment.

A practical example of reducing the influence of the voltage generated between the cathode and anode of the variable capacitance diode 3 is explained below by referring to FIG. 8.

As described above, the impedance Zc of the capacitor 51 is calculated as follows when C, $R_1$, and $R_2$ are set to 1000 pF, 1K$\Omega$, and 30K$\Omega$ respectively.

$$ZC = 1/(2\pi F \cdot C) \qquad (4)$$

(where f indicates a frequency)

If the oscillation frequency f0 of the voltage control oscillator is 10 MHz when f and C are assigned 10 MHz and 1000 pF respectively in equation (4), then Zc≈16$\Omega$ when viewed from the oscillator circuit 9. At this time, the Vc (voltage at both ends of the capacitor 51) shown in FIG. 8 is calculated as follows.

$$Vc = V_1 \cdot Zc/(R_1 + Zc) \qquad (5)$$

If $R_1 = 1K\Omega$ and $Zc = 16\Omega$ are assigned to equation (5), then $Vc = 0.02 \cdot V_1$ ($V_1$ indicates the oscillation voltage generated between the cathode and anode of the variable capacitance diode 3), thereby considerably reducing the voltage generated between the cathode and anode through the rectification of the variable capacitance diode 3.

On the other hand, when viewed from the input terminals 5a and 5b, the control voltage applied to the input terminals 5a and 5b is normally a direct current. In case of a direct current, the frequency f is 0 Hz. Therefore, if f=0 Hz to equation (4), then the impedance Zc of the capacitor 51 equals Zc=∞. The voltage at both ends of the capacitor 51 Vc shown in FIG. 8 as viewed from the input terminals 5a and 5b can be calculated by equation (6) where V2 indicates the direct current control voltage received at the input terminals 5a and 5b.

$$Vc = V_2 \cdot Zc/R_2 + Zc) \qquad (5)$$

If $R_2 = 30K\Omega$ and $Zc = \infty$ are assigned to equation (6), then Vc equals V2, and the direct current control voltage applied to the input terminals 5a and 5b is applied as is to the variable capacitance diode 3.

Even if the frequency of the control voltage applied to the input terminals 5a and 5b is f=1 KHz (for use in modulation), the direct current control voltage applied to the input terminals 5a and 5b is hardly lowered when applied to the variable capacitance diode 3. If f=1 KHz is assigned to equation (4), then the impedance Zc of the capacitor 51 results in Zc≈159K$\Omega$. If $R_2 = 30K\Omega$ and Zc=159K$\Omega$ are assigned to equation (6), then Vc=0.84·V2. Therefore, the direct current control voltage applied to the control input terminals 5a and 5b is not lowered considerably and applied to the variable capacitance diode 3.

Thus, when viewed from the oscillator circuit 9, the impedance of a capacitor is extremely small. On the other hand, when viewed from the input terminals 5a and 5b, it can be extremely large. Therefore, the direct current generated between the cathode and anode of the variable capacitance diode 3 can be reduced to the smallest possible level, causing no problem. The control voltage applied through the input terminals 5a and 5b receives no influence from the capacitor 51 and is applied, as almost unchanged, to the variable capacitance diode 3.

Figure 9:
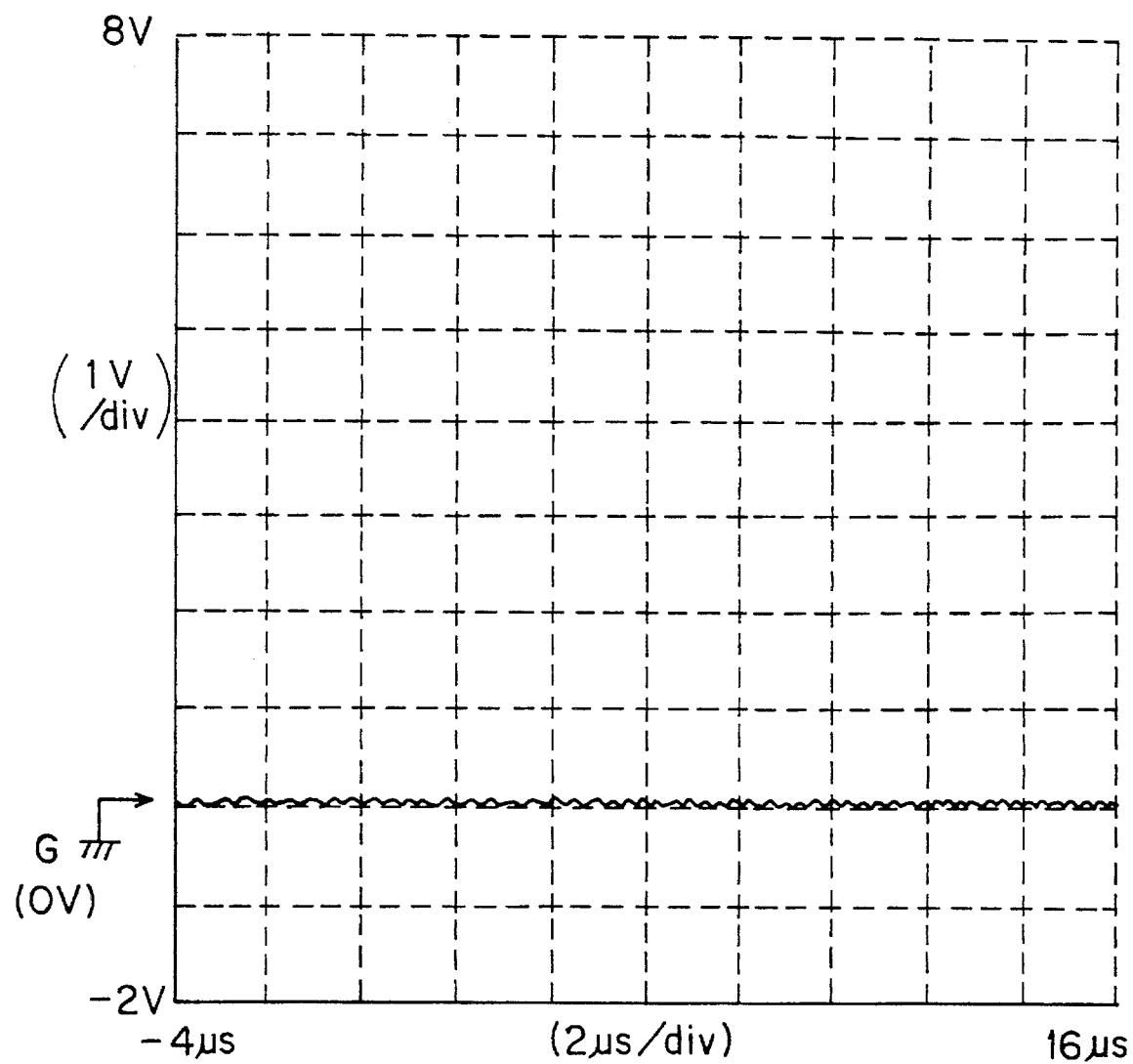
FIG. 9 shows an example (1) of reducing the voltage generated at both ends of the variable capacitance diode according to the embodiment.
Figure 10:
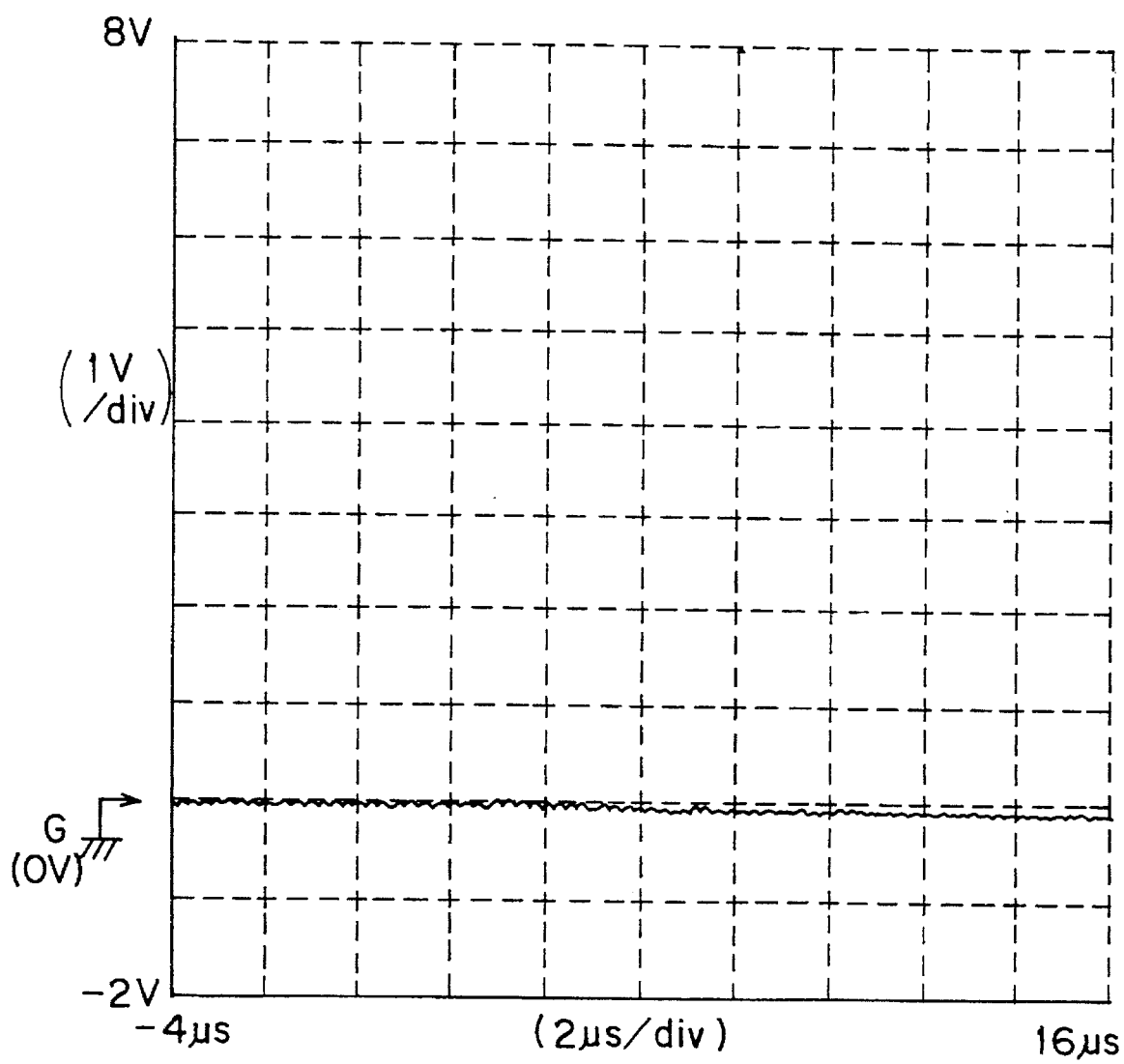
FIG. 10 shows an example (2) of reducing the voltage generated at both ends of the variable capacitance diode according to the embodiment.

FIGS. 9 and 10 show actual data provided by an oscilloscope about the above described operation. The vertical axis indicates the voltage of the capacitor 51, that is, a potential applied to the cathode of the variable capacitance diode 3. The horizontal axis indicates time. FIG. 9 shows an example of data with the resistance value $R_1$ of the resistor 41 set to 300Ω; the resistance value $R_2$ of the resistor 42 set to 30KΩ; and the capacitance of the capacitor 51 set to 1000 pF. FIG. 10 shows an example of data with the resistance value $R_1$ of the resistor 41 set to 200Ω; the resistance value $R_2$ of the resistor 42 set to 30KΩ; and the capacitance of the capacitor 51 set to 1000 pF. According to the data, the potential at the cathode of the variable capacitance diode 3 is approximately at the ground level G (120 mV at maximum) in FIG. 9 with the control voltage of 0 V even if a direct current voltage is generated between the cathode and anode of the variable capacitance diode 3 through the rectification. Likewise, in FIG. 10, the potential at the cathode of the variable capacitance diode 3 is lowered almost to the ground level G (67.06 nV at maximum).

Thus, when the control voltage varies in the range from 0 V to 5 V, an oscillation frequency corresponding to the control voltage of 0 V can be obtained with the control voltage set to 0 V. Therefore, even when the control voltage is low, the oscillation frequency can be lowered to a desired value, thereby approximately matching the actual range of the oscillation frequency with the logically calculated range of the oscillation frequency. That is, the oscillation frequency can vary with the variations of the control voltage as shown by the dashed line in FIG. 2.

Described below is another explanation of the principle of the operation according to the present invention.

The impedance element 6a, for example the resistor 41, exists at the oscillation frequency f0 when the input terminal of the control voltage is viewed from the variable capacitance diode 3. This is because the impedance of the capacitor 51 is smaller than that of the resistor 41. The resistor 41 is connected in parallel with the variable capacitance diode 3 as a load to the oscillator circuit 9, and the load reduces the oscillation frequency. For example, if the variable capacitance diode is a silicon diode, then the junction voltage is 0.7 V, thereby almost removing the rectification when the oscillation amplitude (P-P voltage) is equal to or lower than 1.4 V (actually a little rectification is detected, but an electric charge passes through the resistors 41 and 42 and the generated voltage is almost 0).

As described above, setting the value of the resistor 41 and the voltage such that the variable capacitance diode 3 is allowed to perform a proper rectifying operation to prevent the generation of a direct current voltage.

Figure 11:
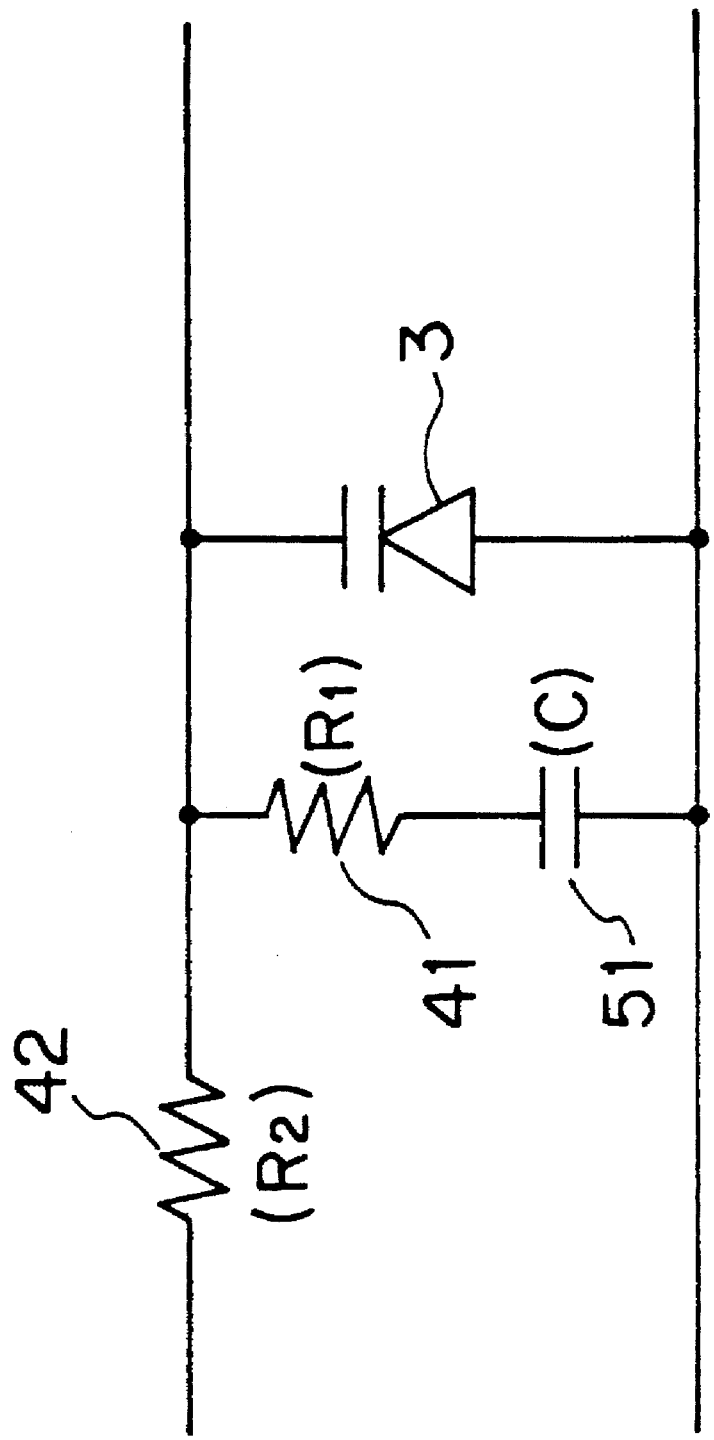
FIG. 11 shows the circuit of another embodiment of the present invention.

According to the embodiment of the present invention, the resistor 41 and the capacitor 51 form a filter to reduce the influence of the oscillation at the input terminal of the control voltage. However, the present invention is not limited to this application, and can be designed to improve the linearity of the variations of the oscillation frequency to the control voltage by reducing only the oscillation amplitude with the configuration of the resistors 41 and 42, capacitor 51, and variable capacitance diode 3 as shown in FIG. 11.

Figure 12:
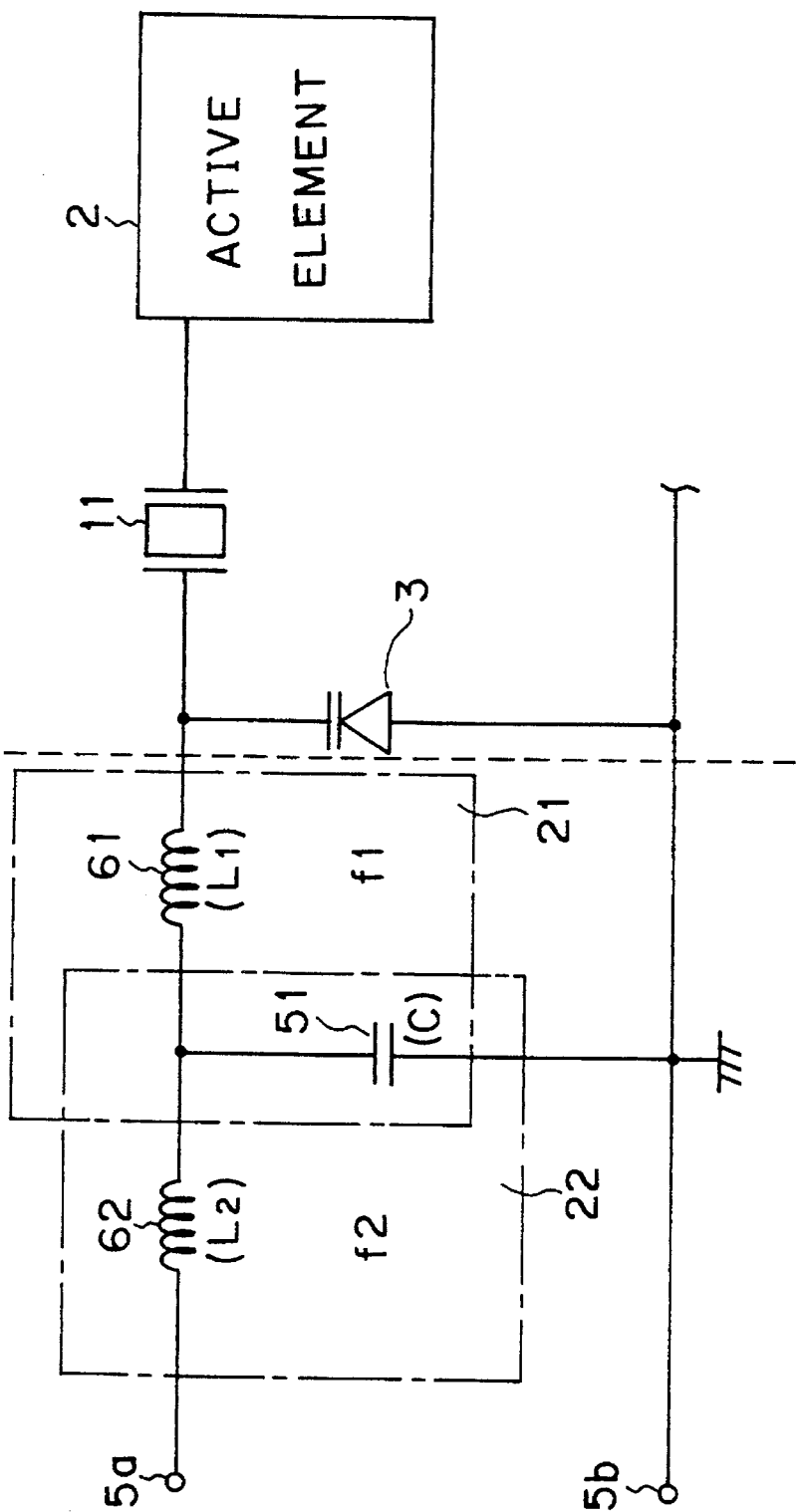
FIG. 12 shows a variation (1) of the embodiment.
Figure 13:
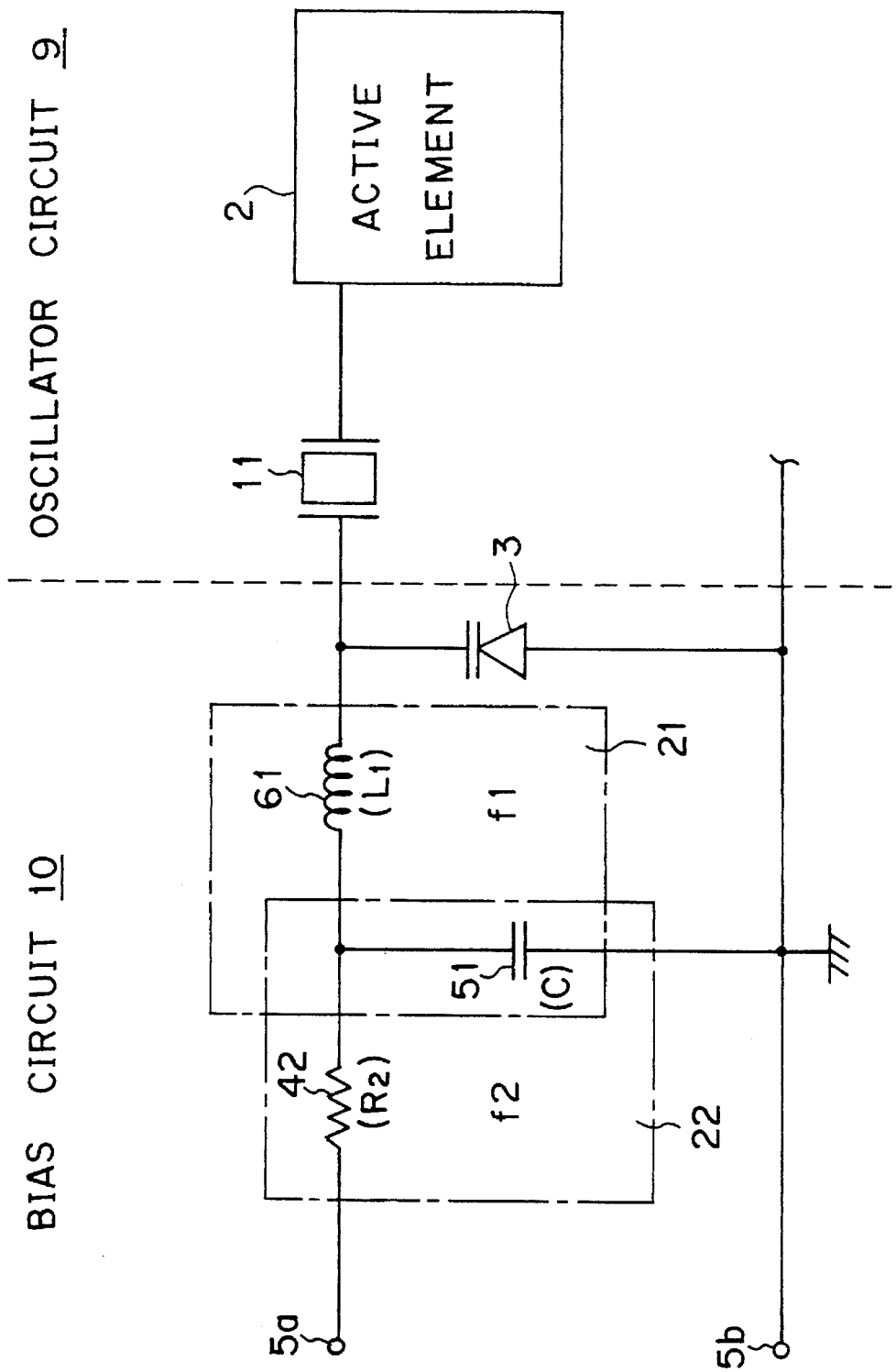
FIG. 13 shows a variation (2) of the embodiment.

According to the present invention, a resistance is used as an impedance element and divided into two units. Obviously, the configuration can be as shown in FIGS. 12 and 13. FIG. 12 shows an example in which coils 61 and 62 are used instead of the resistors 41 and 42, and FIG. 13 shows an example in which the resistor 41 near the variable capacitance diode 3 is replaced with the coil 61.

In FIG. 12, two coils 61 and 62 are connected serially. The relation between the cut-off frequency f1 of the first low-pass filter 21 comprising the coil 61 near the variable capacitance diode 3 and the capacitor 51 and the cut-off frequency f2 of the second low-pass filter 22 comprising the coil 62 near input terminal 5a of the control voltage and the capacitor 51 can be set as f1>f2.

The cut-off frequency f1 in the example shown in FIG. 12 can be calculated by equation (7) where $L_1$ indicates the inductance of the coil 61; and C indicates the capacitance of the capacitor 51.

$$f1 = 1/(2\pi \sqrt{L_1 \cdot C}) \qquad (7)$$

The cut-off frequency f2 in the example shown in FIG. 12 can be calculated by equation (8) where $L_2$ indicates the inductance of the coil 62; and C indicates the capacitance of the capacitor 51.

$$f2 = 1/(2\pi \sqrt{L_2 \cdot C}) \qquad (8)$$

The relation between the cut-off frequency f1 of the first low-pass filter 21 and the oscillation frequency f0 of the voltage control oscillator can be f1<f0, that is, calculated by the following equation (9).

$$1/(2\pi \sqrt{L_1 \cdot C}) < f0 \qquad (9)$$

In FIG. 13, the relation between the cut-off frequency f2 of the second low-pass filter 22 comprising the resistor 42 and the capacitor 51 and the cut-off frequency f1 of the first low-pass filter 21 comprising the coil 61 and the capacitor 51 can be set as f1>f2.

The cut-off frequency f2 of the example shown in FIG. 13 can be calculated by equation (2) above, and the cut-off frequency f1 of the example shown in FIG. 13 can be calculated by equation (7) above.

In this case, the relation between the cut-off frequency f1 of the first low-pass filter 21 and the oscillation frequency f0 of the voltage control oscillator can be set as f1<f0, that is, can be calculated by equation (9) above.

Figure 14:
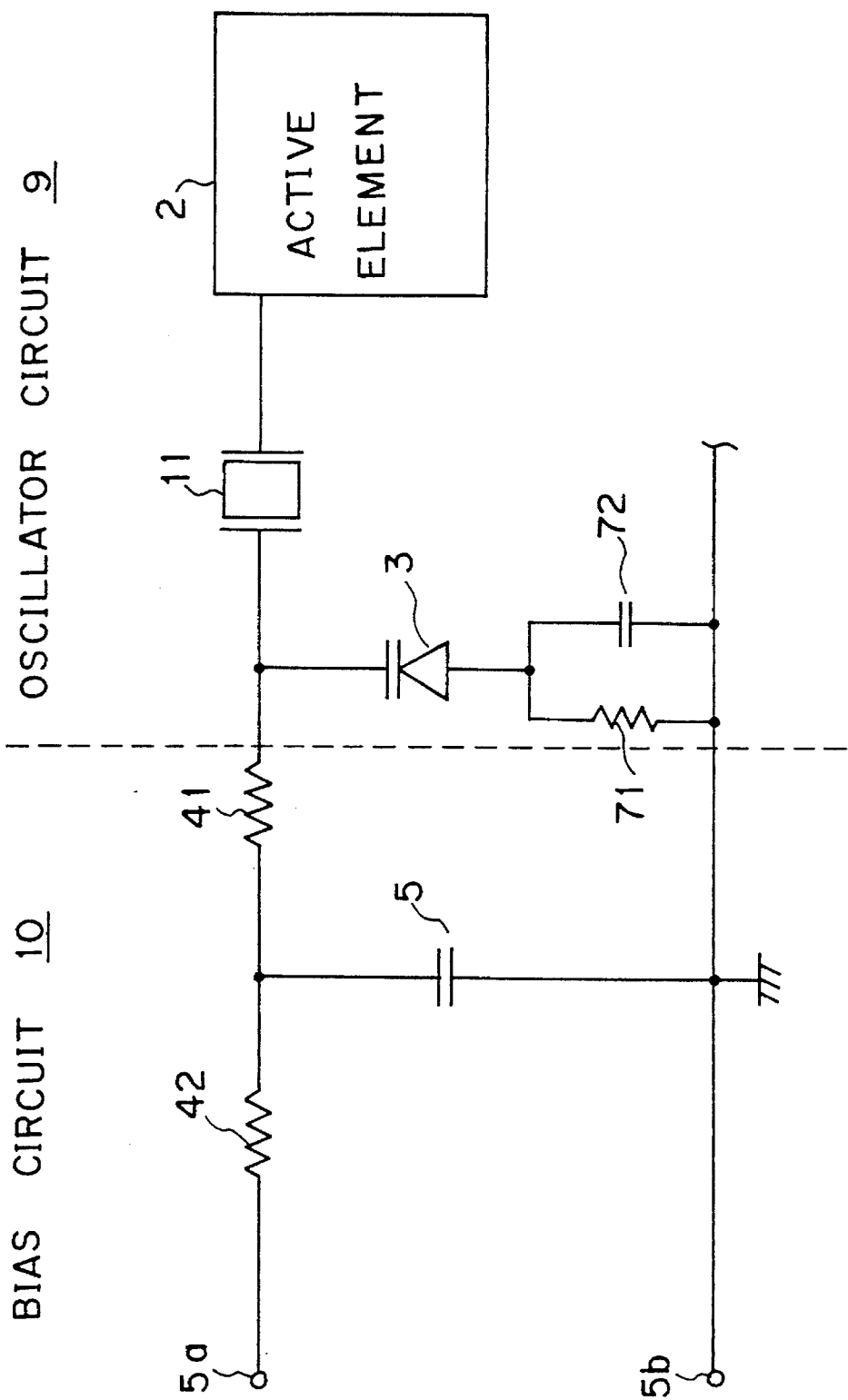
FIG. 14 shows a variation (3) of the embodiment.
Figure 15:
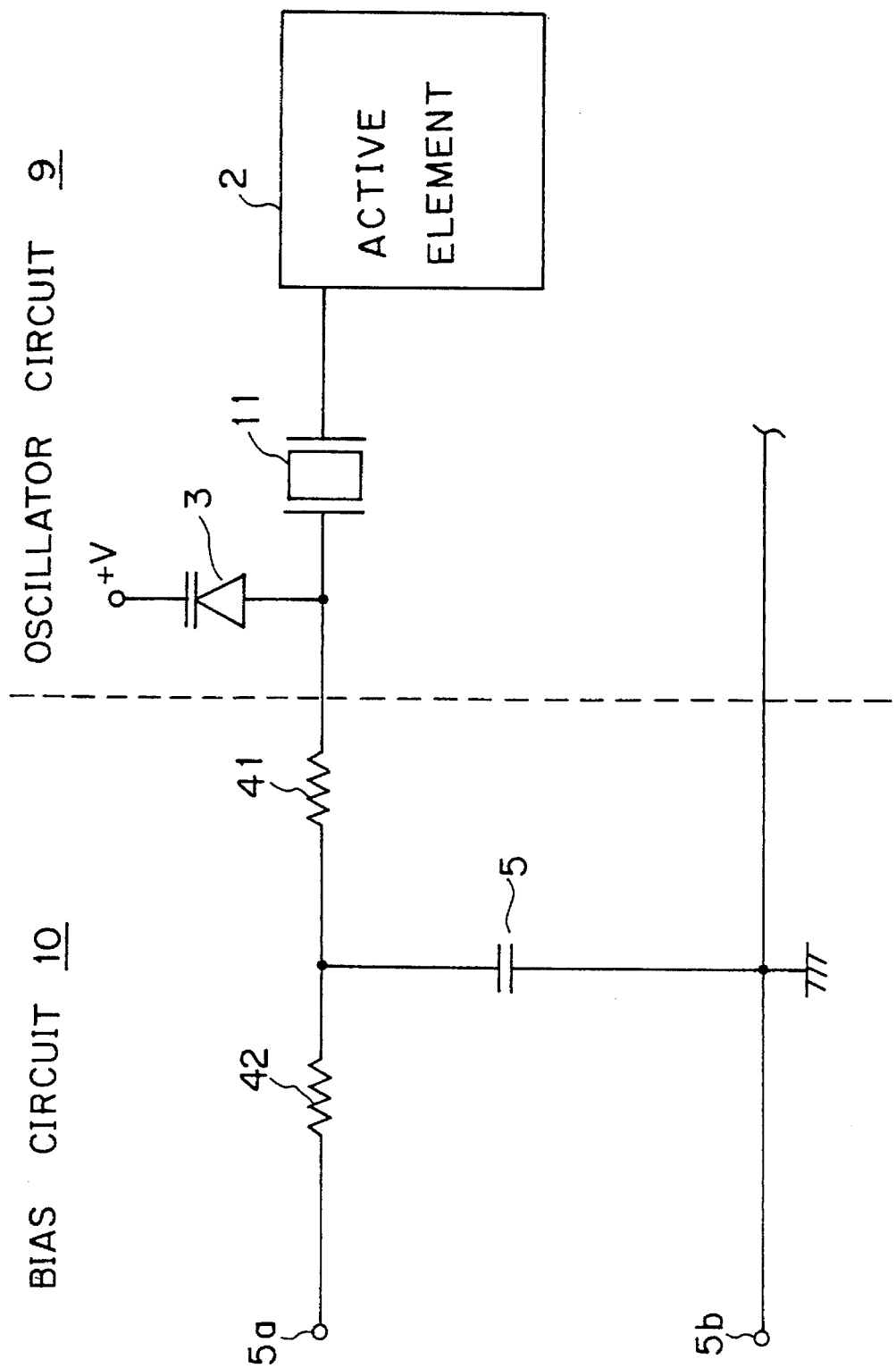
FIG. 15 shows a variation (4) of the embodiment.

In the above described embodiment, the output terminal of the anode of the variable capacitance diode 3 is directly grounded, but it also can be grounded through the parallel circuit comprising a resistor 71 and a capacitor 72 as shown in FIG. 14. This configuration is adopted when, for example, modulated voice data is applied to the anode of the variable capacitance diode 3. It can be also used when a positive potential is applied to the cathode of the variable capacitance diode 3 as shown in FIG. 15.

Figure 16:
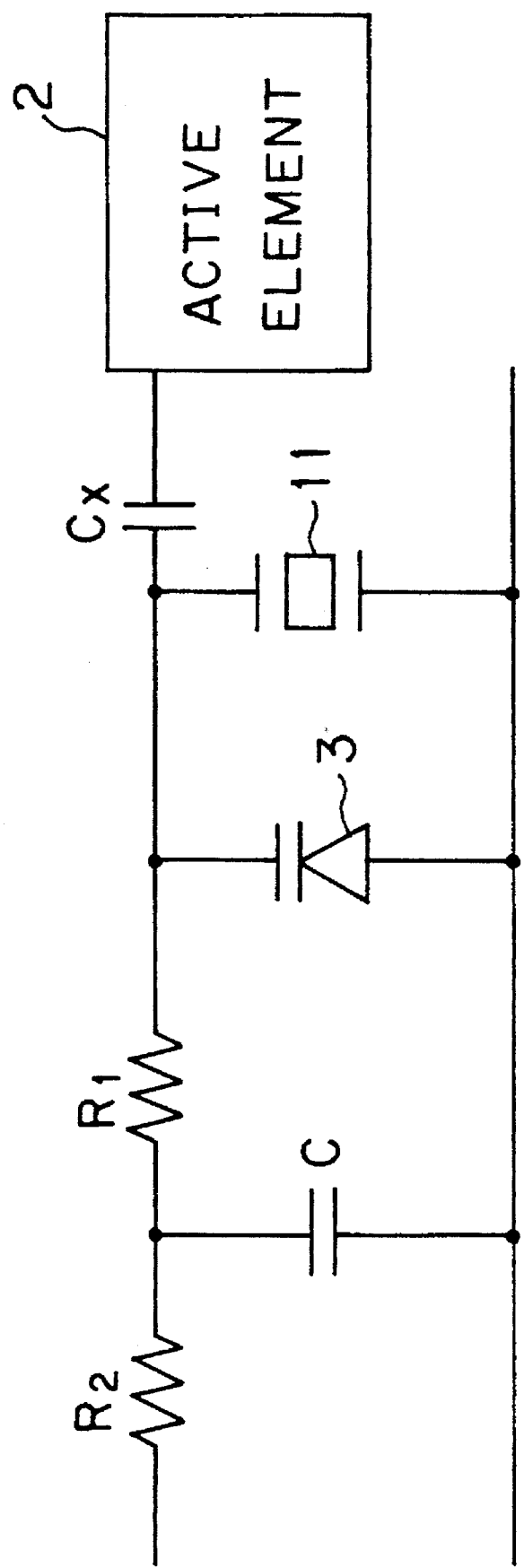
FIG. 16 shows the circuit according to an embodiment of the present invention.
Figure 17:
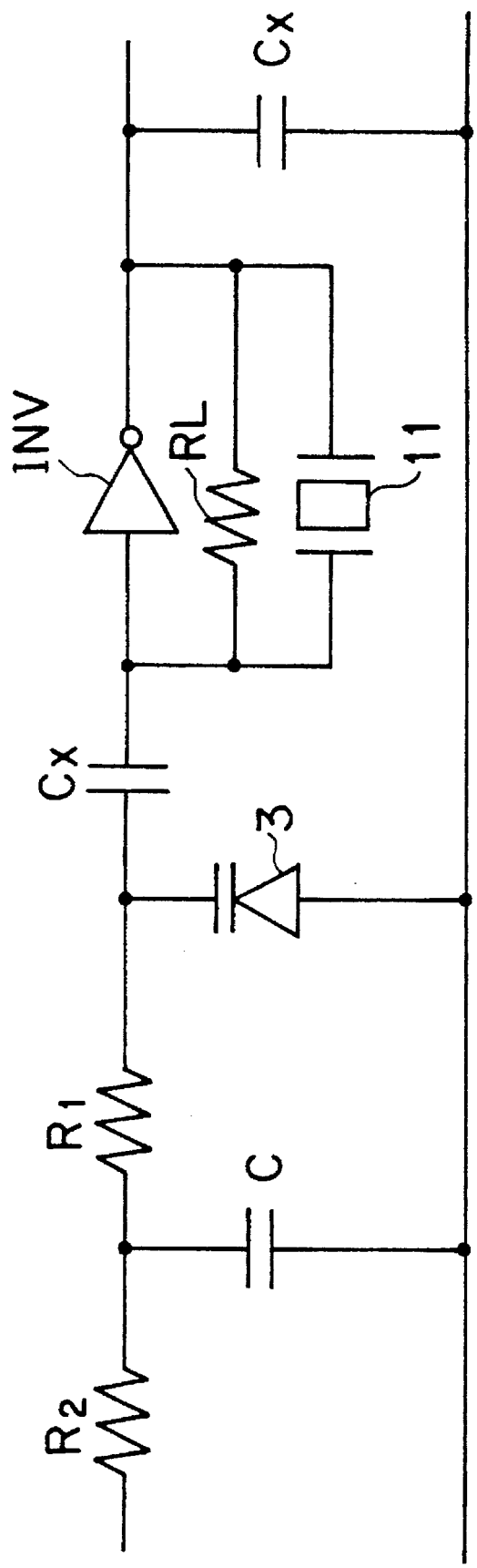
FIG. 17 shows the circuit according to an embodiment of the present invention.

Furthermore, the present invention is not limited to the use for the above mentioned circuit, but functions effectively when a capacitor $C_x$ is inserted as shown in FIG. 16 to prevent a direct current voltage from being applied to an active element. The present invention functions in the same manner when applied to an oscillator circuit comprising an inverter INV and a resistor RL as active elements as shown in FIG. 17. In this circuit, the capacitor $C_x$ shown in FIG. 16 is required.

Used in the above described embodiment are lithium tantalate and crystal resonators as inductive oscillation element, but coils and strip lines can also be used as inductive resonators.

Figure 18:
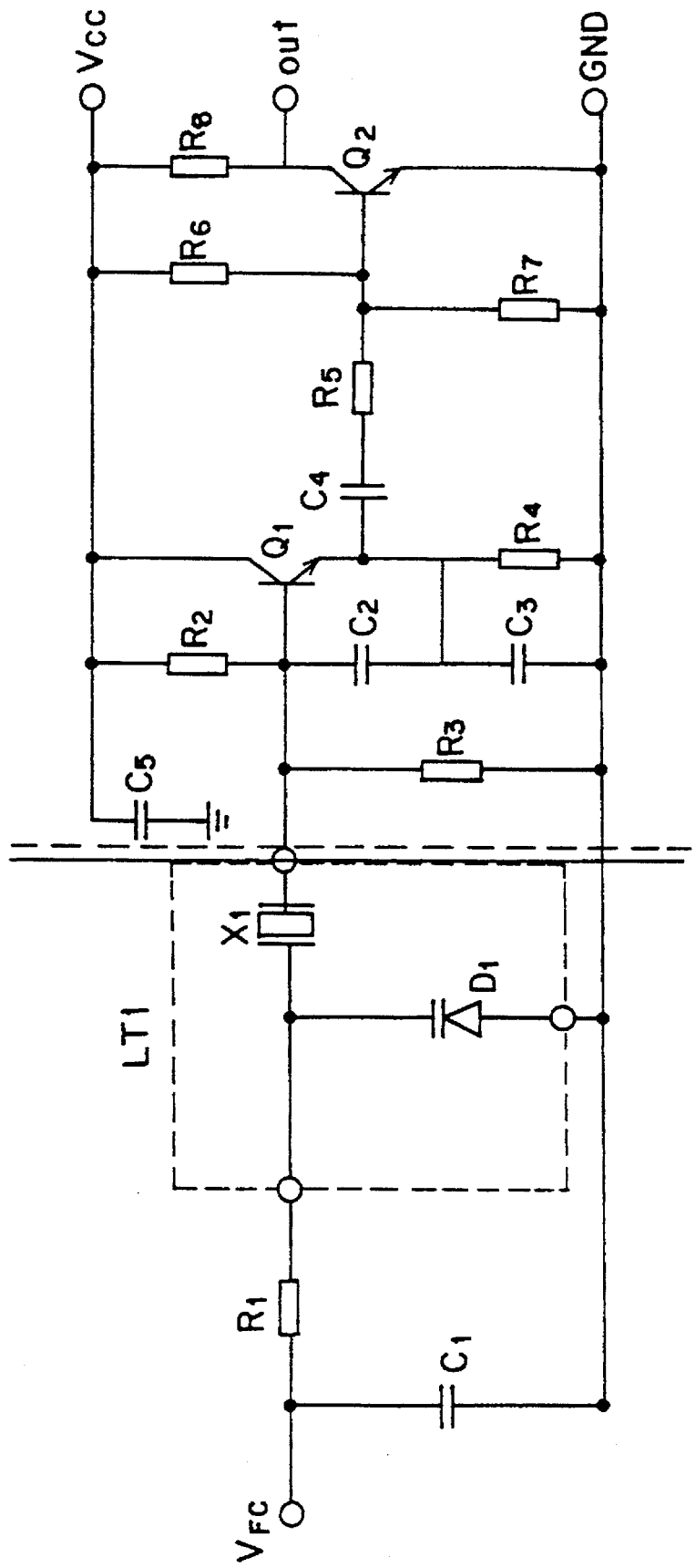
FIG. 18 shows the circuit according to an embodiment of the present invention.

FIG. 18 shows in detail the circuit of the oscillator according to the embodiment of the present invention. The oscillator shown in FIG. 18 has the configuration of a Colpitts oscillator circuit fundamentally comprising a transistor Q1, capacitors C2 and C3, and a variable capacitance diode D1.

FIGS. 19 shows the resistance value of the above described oscillator, and FIG. 20 shows the capacitance of the capacitor.

Resistances or resistors R1 and R7 are set to 33KΩ; resistance of resistor R2 is set to 24KΩ; resistances of resistors R3 and R6 are set to 47KΩ, resistances of the resistors R4 and R5 are set to 470KΩ, resistance of resistor R8 is set to 1KΩ, transistor Q1 is set to 2SC 2480; transistor Q2 is set to 2SC 2480; and the diode is set to 2X 1C 0054. The type of transistor Q2 depends on the oscillation frequency of the oscillator. The oscillation frequency of the oscillator works within the range of the inductance of crystal X1.

In the circuit shown in FIG. 18, another crystal unit is used and the capacitance of the capacitor depends on the oscillation frequency.

As shown in FIG. 20, capacitance of capacitor C1 is set to 1,000 pF; capacitance of capacitor C2 is set to 100 pF; capacitances of capacitors C3 and C4 are set to 56 pF; and capacitance of capacitor C5 is set to 1,000 pF. The value 40 mW written to the right of the value of the resistance indicates the maximum power consumption of the resistance. The values 25 V and 50 V written for respective capacitors indicate their maximum voltages.

Resistors R2 through R7 except R1 are used for the bias voltages of transistors Q1 and Q2. Transistor Q1 is used for oscillation, and transistor Q2 for amplification. Transistor Q2 also functions as an isolation amplifier to attenuate the fluctuation of the oscillation responsive to the variation of a load.

In the circuit shown in FIG. 18, resistance R1 affects the oscillation as if it were connected in parallel with the variable capacitance diode D1 with the capacitor C1 having a low impedance on the oscillation frequency. Particularly, resistance R1 works as a load and reduces the oscillation amplitude. Resistor R1 has no influence with the capacitor C1 having a high impedance on a modulated frequency. With this circuit, a small oscillation amplitude is applied to the diode D1, and the bias voltage indicates no change through the rectification of the diode D1, thereby improving the linearity of the oscillation and obtaining an oscillator circuit which produces the oscillation frequency linearly changing according to the modulated voltage $V_{FC}$.

A Colpitts oscillator circuit is used in the embodiment shown in FIG. 18. However, the embodiment is not limited to this application and can include a Hartley oscillator circuit, a variation of these circuits, or any other circuit. The L-shaped filter comprising the capacitor C1 and the resistor R1 can also be designed as a T-shaped filter having resistances at input and output terminals.

Figure 1:
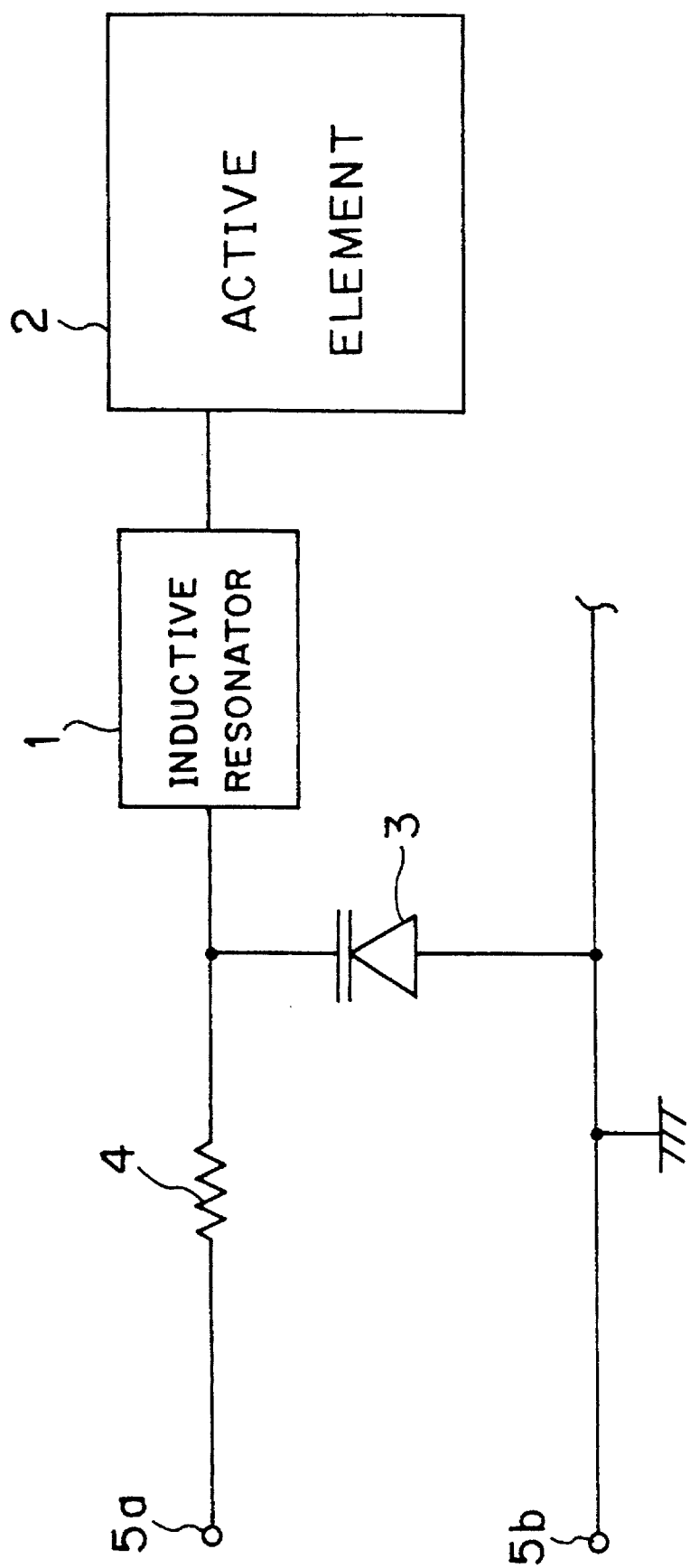
FIG. 1 shows the configuration of the conventional voltage control oscillator.
Figure 2:
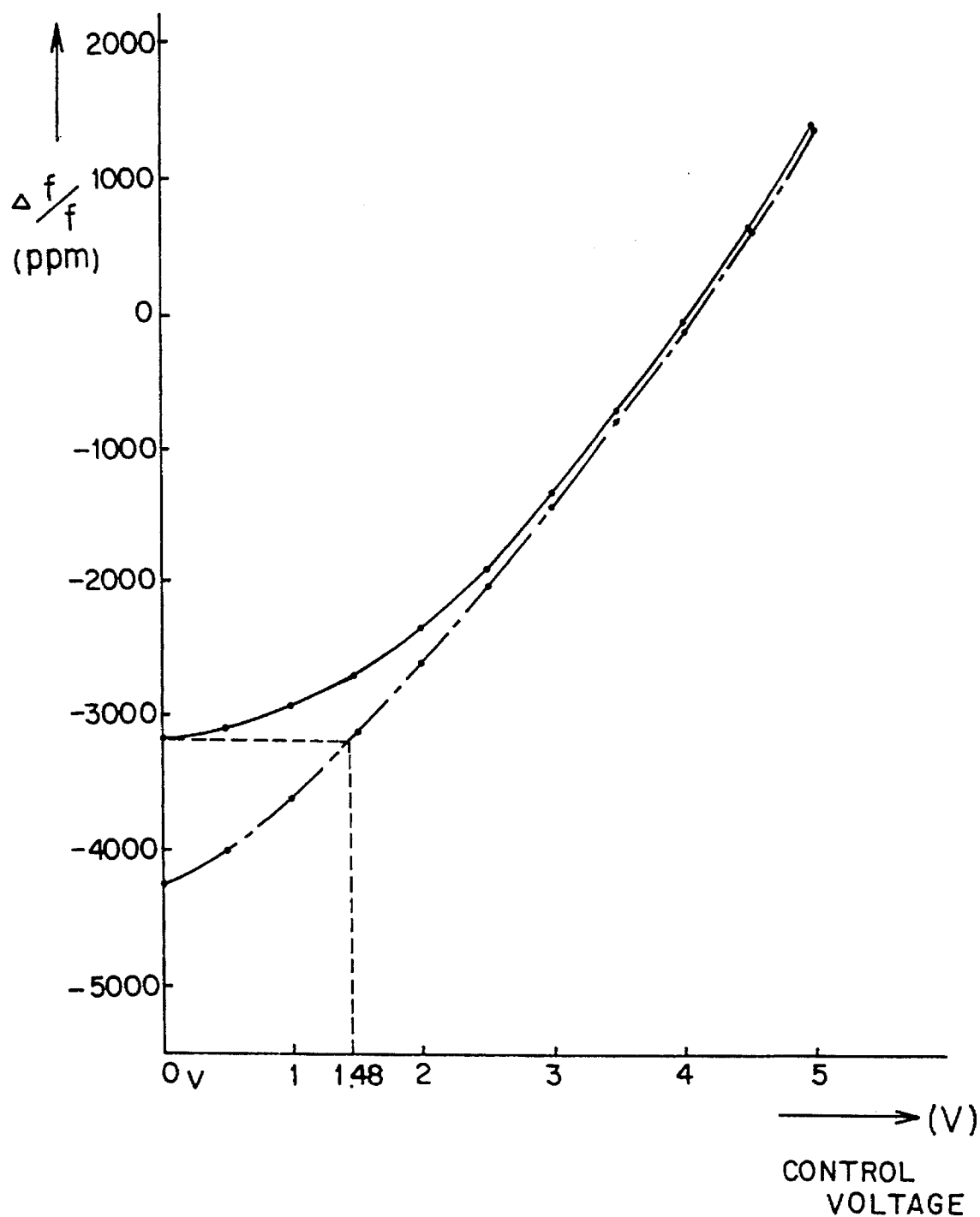
FIG. 2 shows the range of the oscillation frequency obtained by the conventional voltage control oscillator.
Figure 3:
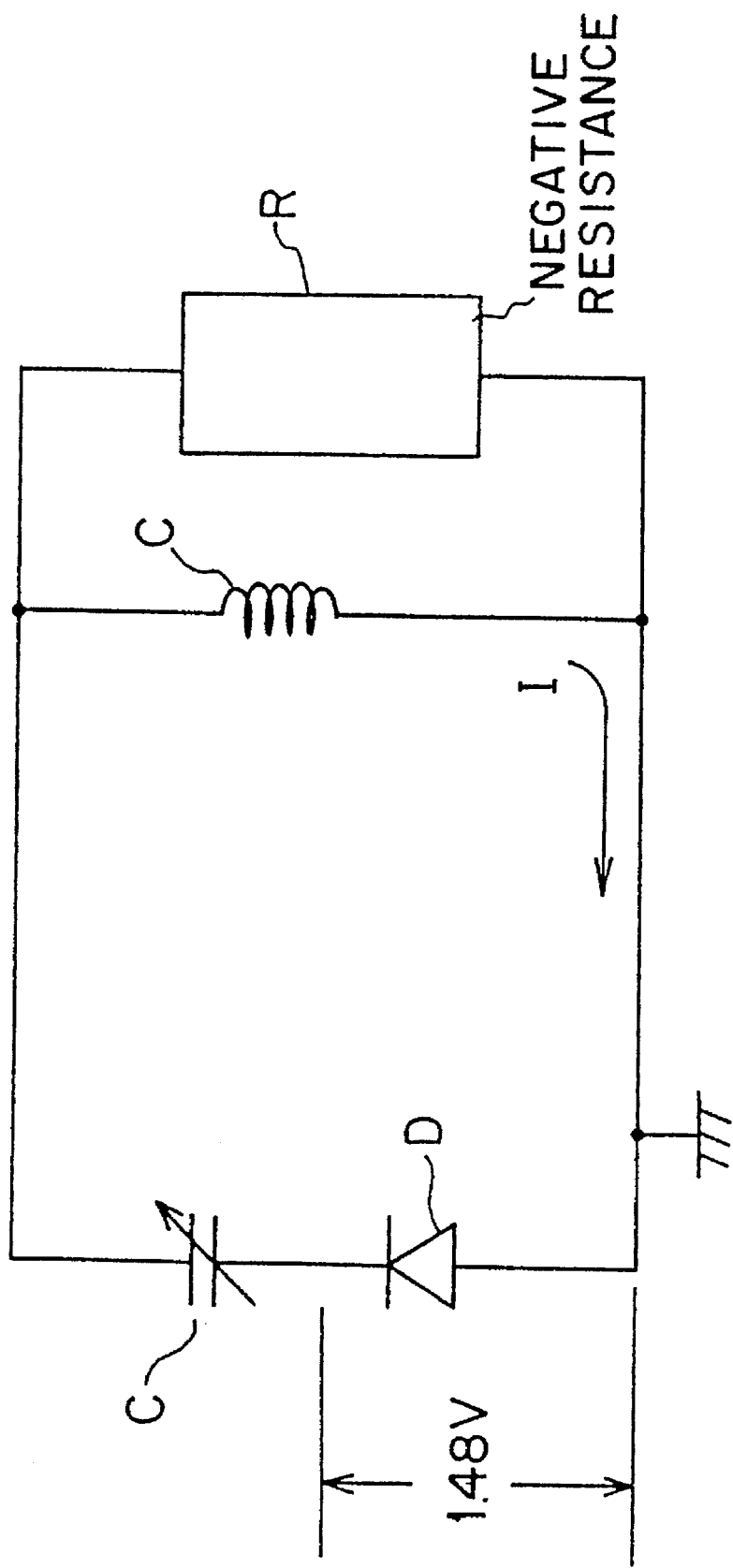
FIG. 3 shows the circuit equivalent to the oscillator circuit to explain the operation of the conventional voltage control oscillator.
Figure 4:
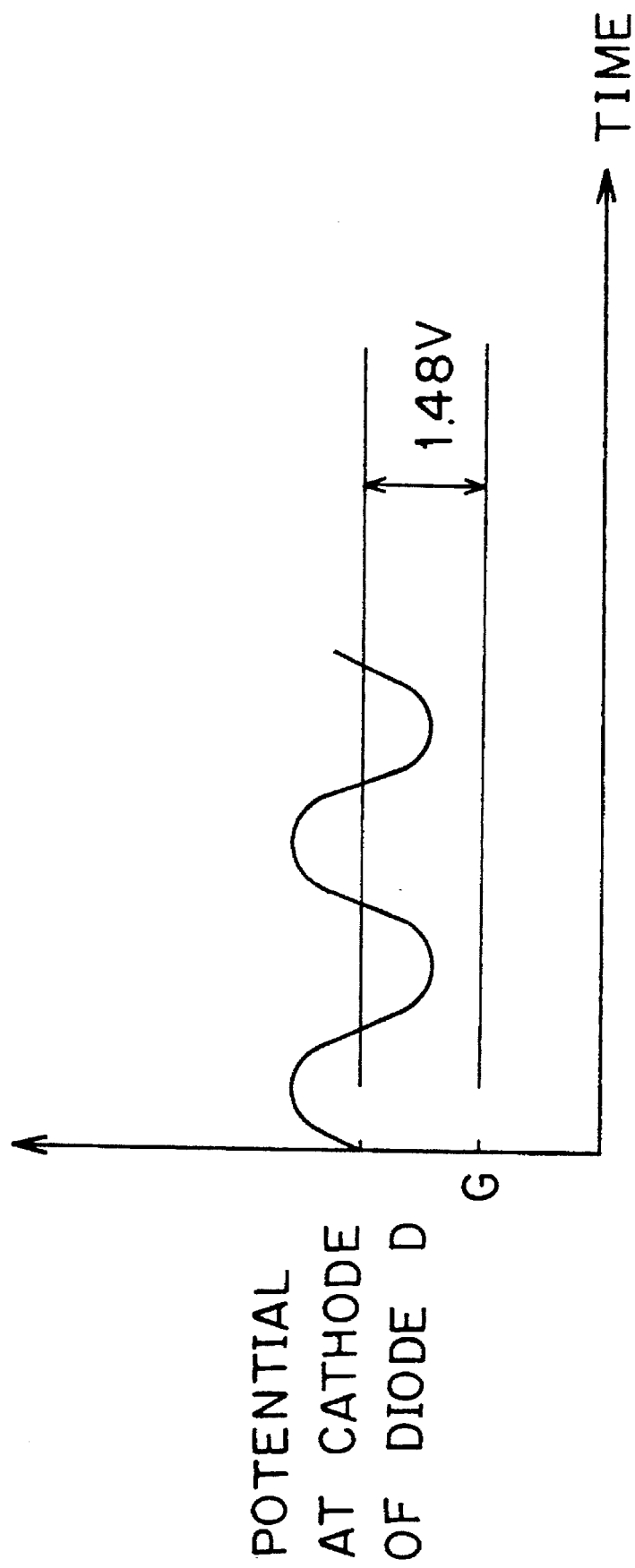
FIG. 4 shows the voltage generated by the rectification of the variable capacitance diode.
Figure 5:
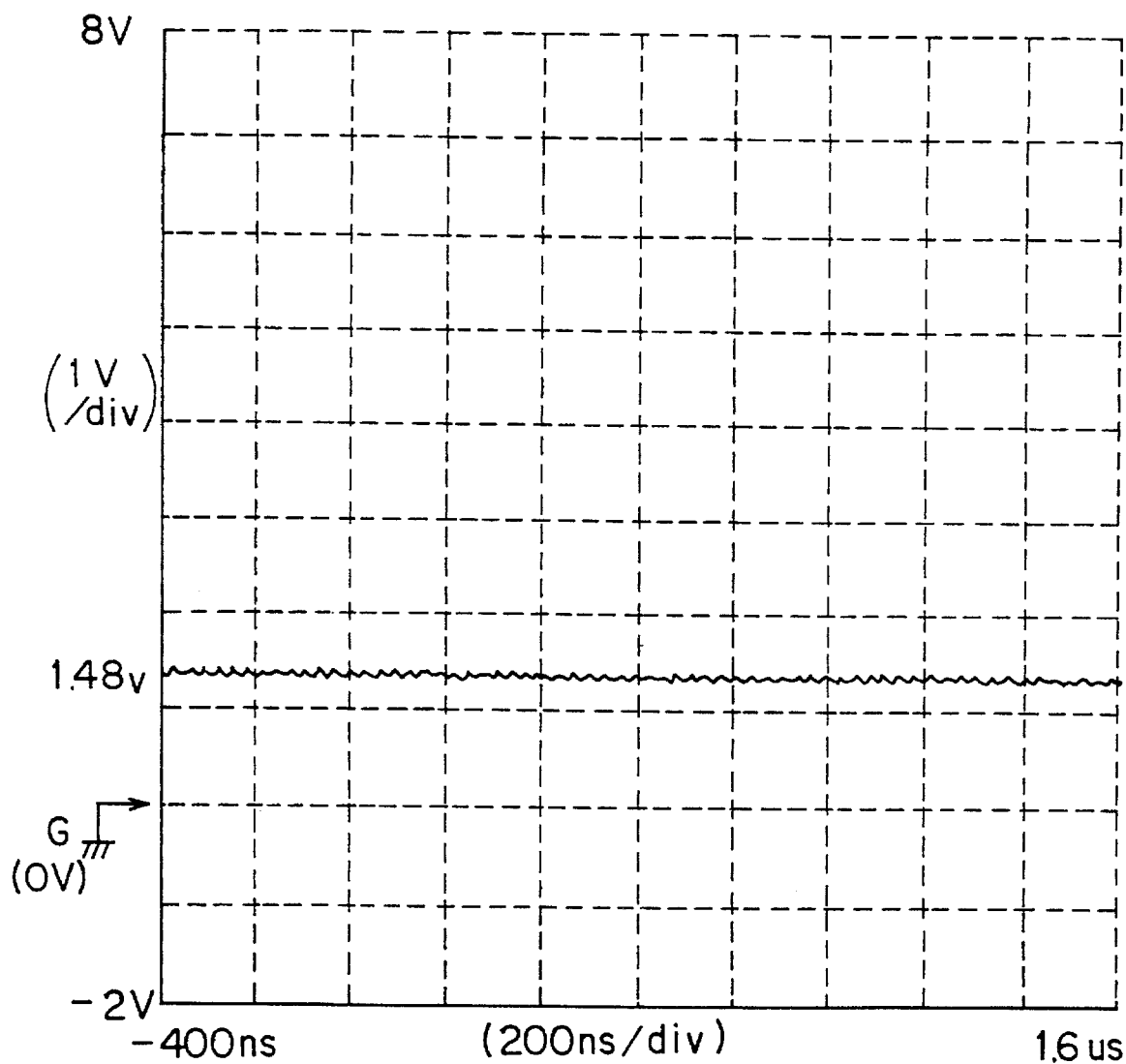
FIG. 5 shows a practical example of the voltage generated by the rectification of the variable capacitance diode.

As described above, even if the control voltage of 0 V is applied to change an oscillation frequency, an oscillation frequency can be obtained correspondingly, that is, the range of a oscillation frequency is obtained almost as calculated logically, thereby producing a wide range of oscillation frequency within a predetermined range of the control voltage. Furthermore, the oscillation frequency changes linearly corresponding to the control voltage as shown in FIG. 2, thus realizing a stable operation of a PLL.

What is claimed is:

1. A voltage control oscillator which has an oscillator circuit comprising at least an inductive resonator, active element, and variable capacitance diode, comprising:

a bias circuit comprising a low-pass filter comprising a resistor and a capacitor, said bias circuit reducing oscillation amplitude of the oscillation circuit; and means for externally applying a direct current control voltage to the variable capacitance diode through said bias circuit to change an oscillation frequency by altering a capacitance value of the variable capacitance diode with variations of the direct current voltage, said oscillation frequency being set higher than a cut-off frequency of the low-pass filter.

2. A voltage control oscillator which has an oscillator circuit comprising at least an inductive resonator, active element, and variable capacitance diode, comprising:

a bias circuit comprising at least two serially connected impedance elements and a capacitance element mounted between earth and a connection point between said at least two impedance elements, said bias circuit reducing oscillation amplitude of the oscillation circuit; and means for externally applying a direct current control voltage to the variable capacitance diode through said bias circuit to change an oscillation frequency by altering a capacitance value of the variable capacitance diode with variations of the direct current voltage.

3. The voltage control oscillator according to claim 2, wherein a first impedance element near the variable capacitance diode is set such that the oscillation frequency of the voltage control oscillator is higher than a cut-off frequency of a first low-pass filter comprising the first impedance element and the capacitance element.

4. The voltage control oscillator according to claim 2, wherein a second impedance element near an input terminal of the direct current voltage is set such that a cut-off frequency of a first low-pass filter comprising a first impedance element near the variable capacitance diode and the capacitance element is higher than a frequency of a second low-pass filter comprising the second impedance element and the capacitance element.

5. The voltage control oscillator according to claim 2, wherein a sum of impedance values of said at least two impedance elements ranges from a few ten KΩ to a few hundred KΩ.

6. The voltage control oscillator according to claim 2, wherein one of said at least two impedance elements is a resistance.

7. The voltage control oscillator according to claim 2, wherein said at least two impedance elements comprises a resistance and a coil.

8. The voltage control oscillator according to claim 2, wherein one of said at least two impedance elements is a coil.

9. The voltage control oscillator according to claim 2, wherein said means for externally applying a direct current control voltage is grounded through a resistor and a capacitor connected in parallel to each other.

10. The voltage control oscillator according to claim 2, wherein said inductive resonator is made of either lithium tantalate or quartz crystal.

11. The voltage control oscillator according to claim 2, wherein said inductive resonator is a coil.

12. The voltage control oscillator according to claim 2, wherein said inductive resonator is a strip line formed on a substrate.

* * * * *